US006768685B1

(12) United States Patent
Scheuerlein

(10) Patent No.: US 6,768,685 B1
(45) Date of Patent: Jul. 27, 2004

(54) INTEGRATED CIRCUIT MEMORY ARRAY WITH FAST TEST MODE UTILIZING MULTIPLE WORD LINE SELECTION AND METHOD THEREFOR

(75) Inventor: Roy E. Scheuerlein, Cupertino, CA (US)

(73) Assignee: Mtrix Semiconductor, Inc., Santa Clara, CA (US)

( * ) Notice: Subject to any disclaimer, the term of this patent is extended or adjusted under 35 U.S.C. 154(b) by 0 days.

(21) Appl. No.: 09/990,894

(22) Filed: Nov. 16, 2001

(51) Int. Cl.$^7$ ................................................ G11C 7/00
(52) U.S. Cl. .................. 365/189.07; 365/201; 365/225; 365/243; 365/230.03; 365/230.06; 365/289
(58) Field of Search ................................ 365/201, 225, 365/243, 230.03, 230.06, 189.01, 189.07, 289

(56) References Cited

U.S. PATENT DOCUMENTS

| | | | |
|---|---|---|---|
| 4,646,266 A | 2/1987 | Ovshinsky et al. ......... | 365/105 |
| 4,730,273 A | 3/1988 | Sluss ........................... | 365/96 |
| 4,740,925 A | 4/1988 | Kaszubinski et al. ....... | 365/200 |
| 4,809,231 A | 2/1989 | Shannon et al. ............ | 365/201 |
| 5,241,500 A | 8/1993 | Barth, Jr. et al. ....... | 365/189.01 |
| 5,258,954 A | 11/1993 | Furuyama | |
| 5,315,558 A | 5/1994 | Hag ...................... | 365/230.01 |
| 5,331,594 A | 7/1994 | Hotta ........................ | 365/201 |
| 5,351,214 A * | 9/1994 | Rouy ......................... | 365/210 |
| 5,371,706 A * | 12/1994 | Krentz et al. ............... | 365/201 |
| 5,400,344 A | 3/1995 | Mori ........................ | 371/21.4 |
| 5,428,621 A | 6/1995 | Mehrotra et al. | |
| 5,455,796 A | 10/1995 | Inui et al. .................... | 365/201 |
| 5,469,396 A | 11/1995 | Eltoukhy .................... | 365/210 |
| 5,519,712 A * | 5/1996 | Shu et al. ................... | 365/201 |
| 5,526,312 A | 6/1996 | Eltoukhy .................... | 365/201 |
| 5,568,419 A * | 10/1996 | Atsumi et al. ........... | 365/185.3 |
| 5,572,476 A | 11/1996 | Eltoukhy .................... | 365/210 |
| 5,574,690 A | 11/1996 | Kesel et al. ................ | 365/201 |
| 5,608,670 A | 3/1997 | Akaogi et al. ......... | 365/185.23 |

(List continued on next page.)

OTHER PUBLICATIONS

U.S. App. No. 09/894,704, filed Jun. 29, 2001, "Memory Array Incorporating Noise Detection Line," inventor Roy E. Scheuerlein, 46 pp, U.S. Patent 6,522,594.
Kim C. Hardee and Rahul Sud, "A Fault–Tolerant 30 ns/375 mW 16K x1 NMOS Static RAM,"IEEE Journal of Solid–State Circuits, vol. SC–16, No. 5, Oct. 1981, pp. 435–443.
Toshio Wada et al, "A 15–ns 1024–Bit Fully Static MOS RAM," IEEE Journal of Solid–State Circuits, vol. SC–13, No. 5, Oct. 1978, pp. 635–639.
T. Takeshima et al, A 55ns 16 MbDRAM, ISSCC 89, 1989 International Solid–State Circuits Conference, Session 16: Dynamic RAMs, p. 246–247.

*Primary Examiner*—Connie C. Yoha
(74) *Attorney, Agent, or Firm*—Zagorin, O'Brien & Graham, LLP

(57) ABSTRACT

In a programmable memory array, multiple memory cells on a single bit line may be tested in parallel for the unprogrammed state by simultaneously selecting multiple word lines associated with a selected bit line within a sub-array. A read current flowing through each selected memory cell is added on the selected bit line, and may be sensed using the same bit line sense circuits used for normal read operations. In the test mode, the sense circuit preferably indicates a pass/fail condition for all N simultaneously selected memory cells, which may be directly conveyed as an output signal, or may be combined with other similar pass/fail signals from other selected bit line sense circuits to generate a combined pass/fail output signal. Multiple bit lines may be simultaneously selected within the same sub-array. In addition, multiple sub-arrays may be simultaneously selected, each having one or more simultaneously selected bit lines, and the respective pass/fail signals conveyed directly or combined into fewer numbers of such signals.

68 Claims, 9 Drawing Sheets

U.S. PATENT DOCUMENTS

| | | | | |
|---|---|---|---|---|
| 5,615,164 | A | 3/1997 | Kirihata et al. | 365/230.06 |
| 5,619,460 | A | 4/1997 | Kirihata et al. | 365/201 |
| 5,657,284 | A | 8/1997 | Beffa | 365/201 |
| 5,751,012 | A | 5/1998 | Wolstenholme et al. | 257/5 |
| 5,793,675 | A | 8/1998 | Cappelletti et al. | 365/185.09 |
| 5,835,396 | A | 11/1998 | Zhang | 365/51 |
| 5,848,010 | A | 12/1998 | Sher | 365/201 |
| 5,881,010 | A | 3/1999 | Artieri | 365/222 |
| 5,883,826 | A | 3/1999 | Wendell et al. | 365/63 |
| 5,892,716 | A | 4/1999 | Ingalls | 365/189.05 |
| 5,909,399 | A * | 6/1999 | Tanaka et al. | 365/185.33 |
| 5,995,429 | A | 11/1999 | Kojima et al. | 365/201 |
| 6,034,882 | A | 3/2000 | Johnson et al. | 365/103 |
| 6,038,183 | A | 3/2000 | Tsukude | 365/201 |
| 6,055,180 | A | 4/2000 | Gudesen et al. | 365/175 |
| 6,104,650 | A | 8/2000 | Shore | 365/201 |
| 6,111,801 | A | 8/2000 | Brady | 365/201 |
| 6,112,322 | A | 8/2000 | McGibney et al. | 714/721 |
| 6,125,071 | A | 9/2000 | Kohno et al. | 365/230.03 |
| 6,160,745 | A | 12/2000 | Hashimoto | 365/200 |
| 6,269,036 | B1 * | 7/2001 | Shubat | 365/201 |
| 6,349,065 | B1 * | 2/2002 | Ooishi | 365/201 |
| 6,370,070 | B1 | 4/2002 | Chevallier et al. | |
| 6,407,953 | B1 | 6/2002 | Cleeves | |
| 6,499,124 | B1 * | 12/2002 | Jacobson | 714/727 |
| 6,542,431 | B2 * | 4/2003 | Nakagawa | 365/230.03 |

* cited by examiner

INTEGRATED CIRCUIT MEMORY ARRAY WITH FAST TEST MODE UTILIZING MULTIPLE WORD LINE SELECTION AND METHOD THEREFOR

BACKGROUND

1. Field of the Invention

The present invention relates to semiconductor integrated circuit memory arrays, and particularly those incorporating write-once passive element memory cells incorporating anti-fuses.

2. Description of the Related Art

Manufacturers of integrated circuits that include write-once memory arrays (also known as one-time programmable, or OTP memory arrays), particularly those incorporating anti-fuse memory cells, face difficult testing problems. One such problem concerns testing each unprogrammed memory cell, for it is desirable to test each memory cell to ensure that the unprogrammed state (e.g., high-impedance state) exists at every memory cell location. A standard read mode test can be employed to ensure this. However, the test time required to perform such a read mode test of every memory cell is significant, especially in a very large array such as a three dimensional memory array having upwards of a billion memory cells. Such long test times contribute to increased product manufacturing cost.

With the increasing size of commercially viable memory devices, there remains a continued need for improved and lower cost testing techniques.

SUMMARY

Multiple memory cells on a single bit line may be tested in parallel for the unprogrammed state by simultaneously selecting multiple word lines associated with a selected bit line within a sub-array. A read current flowing through each selected memory cell is added on the selected bit line, thus logically performing an OR function of any selected memory cell found to be in the programmed state. The total read current through one or more selected memory cells onto the selected bit line may be sensed using the same bit line sense circuits used for normal read operations. Separate sense amplifiers may also be used, but are not required, nor is any complicated BIST (i.e., built-in-self-test) logic.

The word line decoding circuitry preferably responds to a test mode signal to cause more than one word line to be selected in the test mode. In an exemplary embodiment, the test mode signal causes a portion of the row address signals to be ignored, which allows more than one word line to be selected. Preferably the ignored address signals represent low-order row address signals and consequently the multiply selected word lines are all adjacent to each other in a contiguous block within a sub-array. Exemplary numbers of simultaneously selected world lines include 4, 8, 16, 32, or 64 word lines, with 16 such simultaneously selected word lines being particularly preferred.

A sense circuit is preferably coupled to the selected bit line and generates a read signal which, in the test mode, indicates a pass/fail condition for all N simultaneously selected memory cells. Such a pass/fail indication may be directly conveyed as an output signal of the integrated circuit, or may be combined with other similar pass/fail signals from other selected bit line sense circuits to generate a combined pass/fail signal representing an even greater number of simultaneously tested memory cells which is then conveyed as an output signal. Multiple bit lines may be simultaneously selected within the same sub-array to each generate a multiple respective pass/fail signals which are then combined into fewer numbers of output signals. In addition, multiple sub-arrays may be simultaneously selected, each having one or more simultaneously selected bit lines, and the respective pass/fail signals conveyed directly or combined into fewer numbers of such signals, including just one such combined pass/fail signal. In certain embodiments, the pass/fail signals may be generated to also indicate a third (e.g., 'marginal') condition, upon which additional and/or more thorough testing may be initiated for the affected memory cells.

The invention may be advantageously applied to parallel testing of memory cells which have a low-current and a high-current state and which contribute such current, when selected, onto an associated bit line. It is particularly useful for testing passive element memory cells to ensure that each memory cell remains in its low current state. Passive element memory cells having anti-fuse elements may be tested in parallel to ensure that each remains in its unprogrammed (i.e., high impedance) state or that no other manufacturing defects are present which contribute current flow onto a selected bit line. The invention is particularly well-suited to three-dimensional memory arrays (i.e., having more than one plane of memory cells) incorporating anti-fuse passive element memory cells. In some embodiments, word lines from each of two layers that are both associated with a single bit line layer may be simultaneously selected to test in parallel memory cells located in two adjacent memory planes.

BRIEF DESCRIPTION OF THE DRAWINGS

The accompanying drawings illustrate one or more embodiments of the present invention and, together with the detailed description, serve to explain the principles and implementations of the invention.

The use of the same reference symbols in different drawings indicates similar or identical items.

DESCRIPTION OF THE PREFERRED EMBODIMENT(S)

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Figure 1:
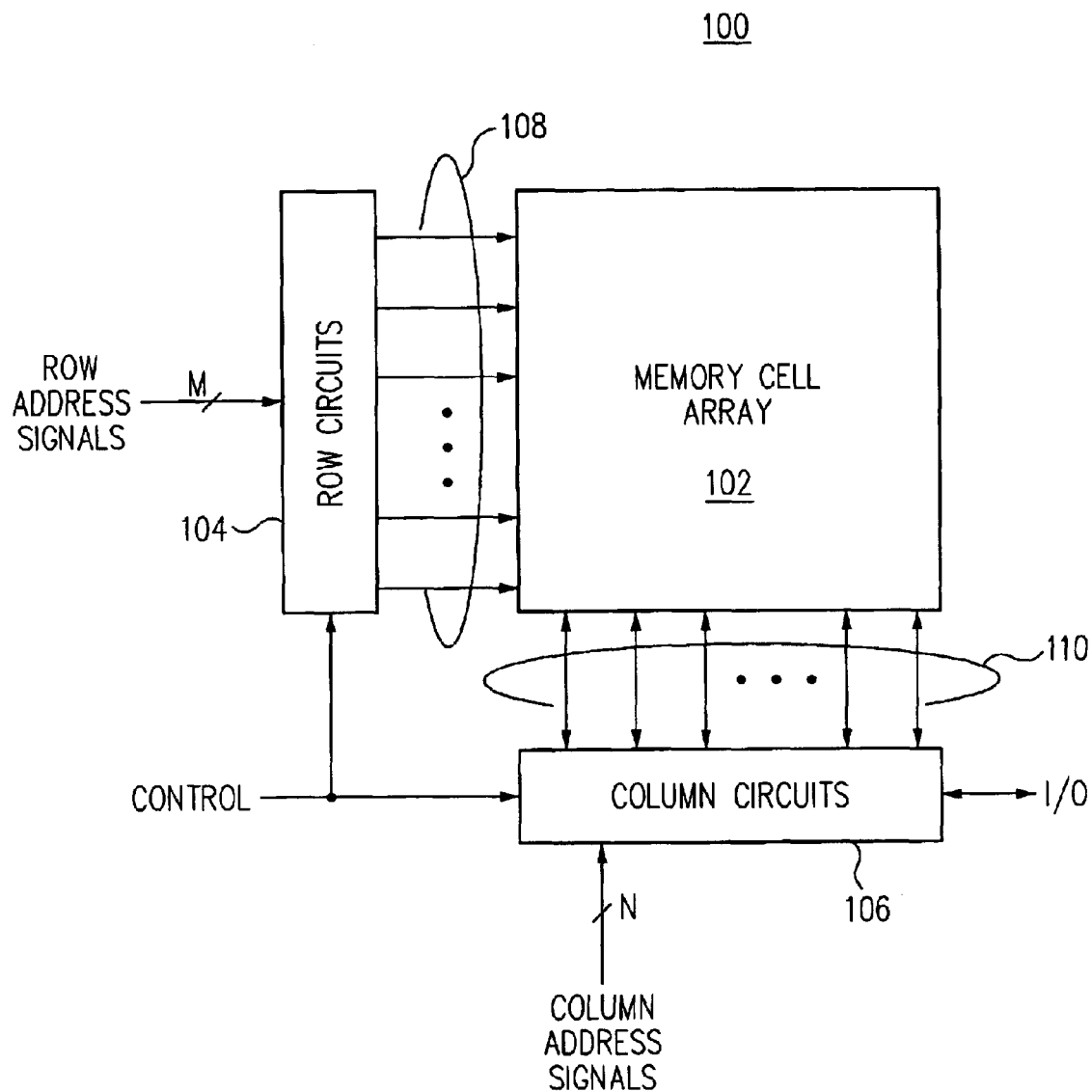
FIG. 1 is a block diagram of a memory array and supporting row and column circuits.

Referring now to FIG. 1, a block diagram is shown of an integrated circuit 100 including a memory array 102. In a preferred embodiment of the invention, the memory array 102 is preferably a three-dimensional, non-volatile, field-programmable write-once memory array of passive element memory cells, although other memory arrays are also suitable and specifically contemplated. Each passive element memory cell within the memory array 102 is generally a two-terminal memory cell having a steering element in series with a state change element, together connected between usually orthogonal (but not necessarily so) array terminal lines. These two elements within a memory cell may both be present before programming. Alternatively, the steering element within a given memory cell may be formed during programming of the memory cell. Suitable state change elements include those having a significant change of resistance, including both fuses and antifuses. A memory cell whose state change element is an antifuse may be termed an antifuse memory cell, whereas a memory cell whose state change element is a fuse may be termed a fuse memory cell.

An advantageous passive element memory cell is a structure combining an antifuse and a diode in series as the memory cell. Particularly suitable memory cells are described in U.S. patent application Ser. No. 09/897,705 entitled "Three-Dimensional Memory Array Incorporating Serial Chain Diode Stack" filed on Jun. 29, 2001, U.S. patent application Ser. No. 09/814,727 entitled "Three-Dimensional Memory Array and Method of Fabrication" filed on Mar. 21, 2001, U.S. patent application Ser. No. 09/560,626 entitled "Three-Dimensional Memory Array and Method of Fabrication" filed on Apr. 28, 2000, and in U.S. Pat. No. 6,034,882 entitled "Vertically Stacked Field Programmable Nonvolatile Memory and Method of Fabrication,", each of which are hereby incorporated by reference in their entirety.

The array terminal lines at one level may be termed word lines or X-lines. The array terminal lines at a vertically adjacent level may be termed bit lines or Y-lines. A memory cell is formed at the intersection of each word line and each bit line, and is connected between the respective intersecting word line and bit line. A three-dimensional memory array which has at least two levels of memory cells may utilize at least more than one layer of word lines or more than one layer of bit lines. A group of word lines, each residing on a separate layer (i.e., level) and substantially vertically-aligned (notwithstanding small lateral offsets on some layers), may be collectively termed a row. The word lines within a row preferably share at least a portion of the row address. Similarly, a group of bit lines, each residing on a separate layer and substantially vertically-aligned (again, notwithstanding small lateral offsets on some layers), may be collectively termed a column. The bit lines within a column preferably share at least a portion of the column address.

The array terminals of memory array 102 include the various layer(s) of word lines organized as rows, and the various layer(s) of bit lines organized as columns. The integrated circuit 100 includes a row circuits block 104 whose outputs 108 are connected to respective word lines of the memory array 102. The row circuits block 104 receives a group of M row address signals and one or more various control signals, and typically may include such circuits as row decoders and array terminal drivers for both read and write (i.e., programming) operations. The integrated circuit 100 also includes a column circuits block 106 whose input/outputs 110 are connected to respective bit lines of the memory array 102. The column circuits block 106 receives a group of N column address signals and one or more various control signals, and typically may include such circuits as column decoders, array terminal receivers, read/write circuitry, and I/O multiplexers. Circuits such as the row circuits block 104 and the column circuits block 106 may be collectively termed array terminal circuits for their connection to the various terminals of the memory array 102.

Integrated circuits incorporating a memory array usually subdivide the array into a sometimes large number of sub-arrays. As frequently used, a sub-array is a contiguous group of memory cells having contiguous word and bit lines generally unbroken by decoders, drivers, sense amplifiers, and input/output circuits. This is done for any of a variety of reasons. For example, the signal delays traversing down word lines and bit lines which arise from the resistance and the capacitance of such lines (i.e., the RC delays) may be very significant in a large array. These RC delays may be reduced by subdividing a larger array into a group of smaller sub-arrays so that the length of each word line and/or each bit line is reduced. As another example, the power associated with accessing a group of memory cells may dictate an upper limit to the number of memory cells which may be accessed simultaneously during a given memory cycle. Consequently, a large memory array is frequently subdivided into smaller sub-arrays to decrease the number of memory cells which are simultaneously accessed. Nonetheless, for ease of description, an array may also be used synonymously with sub-array to refer to a contiguous group of memory cells having contiguous word and bit lines generally unbroken by decoders, drivers, sense amplifiers, and input/output circuits. As used herein, an integrated circuit may include one or more than one memory array.

Figure 2:
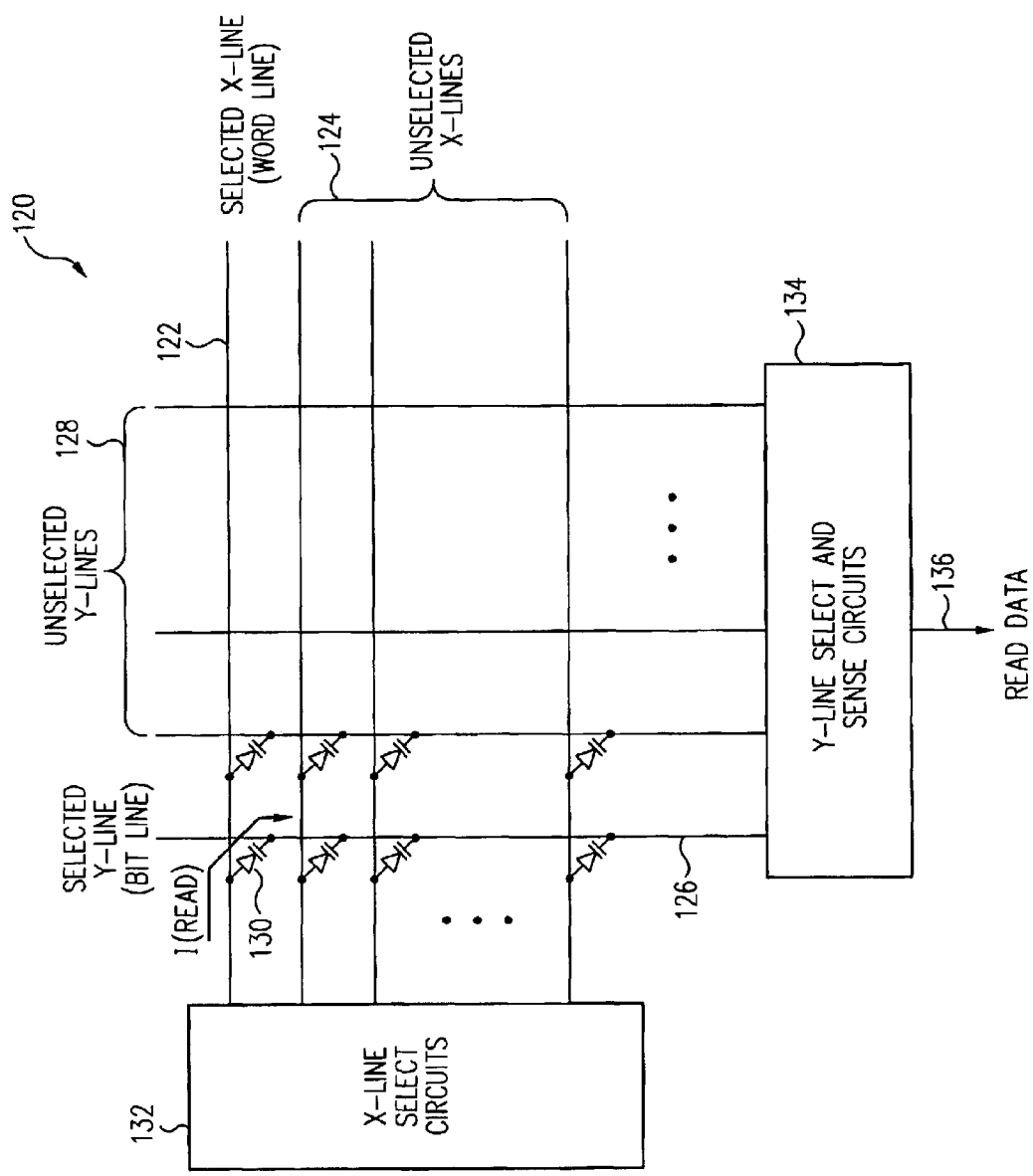
FIG. 2 is an electrical schematic diagram representing a passive element memory array, showing a selected word line (indicated as an X-line), a group of unselected word lines, a selected bit line (indicated as a Y-line), and a group of unselected bit lines, typical of a normal read mode.

FIG. 2 depicts a representation of a single layer of X-lines (e.g., word lines) and a single layer of Y-lines (e.g., bit lines) within a single sub-array 120. In this example, a selected X-line 122 and a group of five unselected X-lines 124 are shown, and a selected Y-line 126 and group of three unselected Y-lines 128 are shown. It is understood that many more such X-lines and Y-lines are usually encountered in a memory array, but the few shown are sufficient to introduce the relevant concepts.

In a preferred embodiment, the memory array 120 includes antifuse memory cells, although other types of passive element memory cells are contemplated, as well as certain other types of memory cells, described later. A selected memory cell 130 is shown coupled between the selected X-line 122 and the selected Y-line 126. A small number of other memory cells are depicted, although it should be understood that a memory cell normally is formed at each intersection of an X-line and a Y-line (not shown).

Each of the X-lines shown are coupled to an X-Line Select Circuits block 132 (which is typically part of the row circuits block 104), and each of the Y-lines shown are coupled to a Y-Line Select and Sense Circuit block 134 (which is typically part of the column circuits block 106). In a traditional read mode, the X-Line Select Circuits block 132 normally selects one particular X-Line in the sub-array by decoding a group of address signals (not shown) and driving the particular X-line to a read bias voltage suitable for a selected X-line. Similarly, the Y-Line Select and Sense Circuit block 134 normally selects one particular Y-Line by decoding another group of address signals (not shown) and coupling a sense circuit to the selected Y-line. The selected Y-line is also biased at a read bias voltage suitable for a selected Y-line, frequently by the sense circuit itself, or alternatively, by a separate bias circuit. In a preferred embodiment the memory array is a fully-decoded array which selects no more than one X-line and one Y-line within a given sub-array to access an associated bit of data. As used herein, a filly decoded array includes those that access more than one bit of data simultaneously, and also those having at least one dimension not equal to an integral power of two. Logic array structures implementing only a portion of the minterms of its input variables are not considered to be fully-decoded arrays.

The respective read bias voltages for the selected X-line and the selected Y-line are preferably chosen to place a forward bias voltage across the selected memory cell so that current flow through the selected memory cell, if any, may be detected. In an exemplary embodiment, the selected X-line 122 is preferably driven to a read bias voltage of about 2.0 volts, and the selected Y-line 126 is driven (i.e., biased at) about ground. The unselected X-lines and unselected Y-lines are biased to respective voltages to reduce or eliminate any significant forward bias voltage across unselected memory cells, with the unselected X-lines preferably biased at or near ground, and the unselected Y-lines preferably biased at or near 2.0 volts. Other suitable bias voltages may be advantageously chosen which are compatible with the particular memory cell technology employed. Particularly suitable bias conditions for a three-dimensional array of non-volatile anti-fuse passive element memory cells are described in U.S. application Ser. No. 09/897,771, entitled "Method and Apparatus for Biasing Selected and Unselected Array Lines When Writing a Memory Array", by Roy E. Scheuerlein, which application is hereby incorporated by reference in its entirety.

If the selected memory cell 130 remains unprogrammed in its high impedance (i.e., low current) state, then a negligible amount of current will flow from the selected X-line 122 into the selected Y-line 126. But if the selected memory cell 130 has been programmed to a low impedance (i.e., high current) state, then that "high" amount of current will flow from the selected X-line 122 into the selected Y-line 126, which current may be detected by the Y-Line Select and Sense Circuit block 134 and buffered to generate a read data signal 136. It should be appreciated that in other embodiments having memory cells forward biased from a Y-line to an X-line, cell current may instead flow from a Y-line to an X-line.

In some cases more than one Y-line may be simultaneously selected that are each associated with a single selected X-line, and each Y-line is typically biased and sensed with a corresponding sense circuit to generate a multi-bit read data output (not shown). However, so that each of the memory cells associated with a given Y-line may be individually determined to be in its respective low-current or high-current state, multiple X-lines are not simultaneously selected, but rather a single X-line is selected from those X-lines associated with a given Y-line. When testing such a memory array, each X-line is traditionally individually selected to determine if the corresponding memory cell presents a high impedance to the Y-line sense circuit. With memory densities approaching billions of memory cells on a single integrated circuit, such testing may consume considerable time and lead to increased manufacturing costs.

Figure 3:
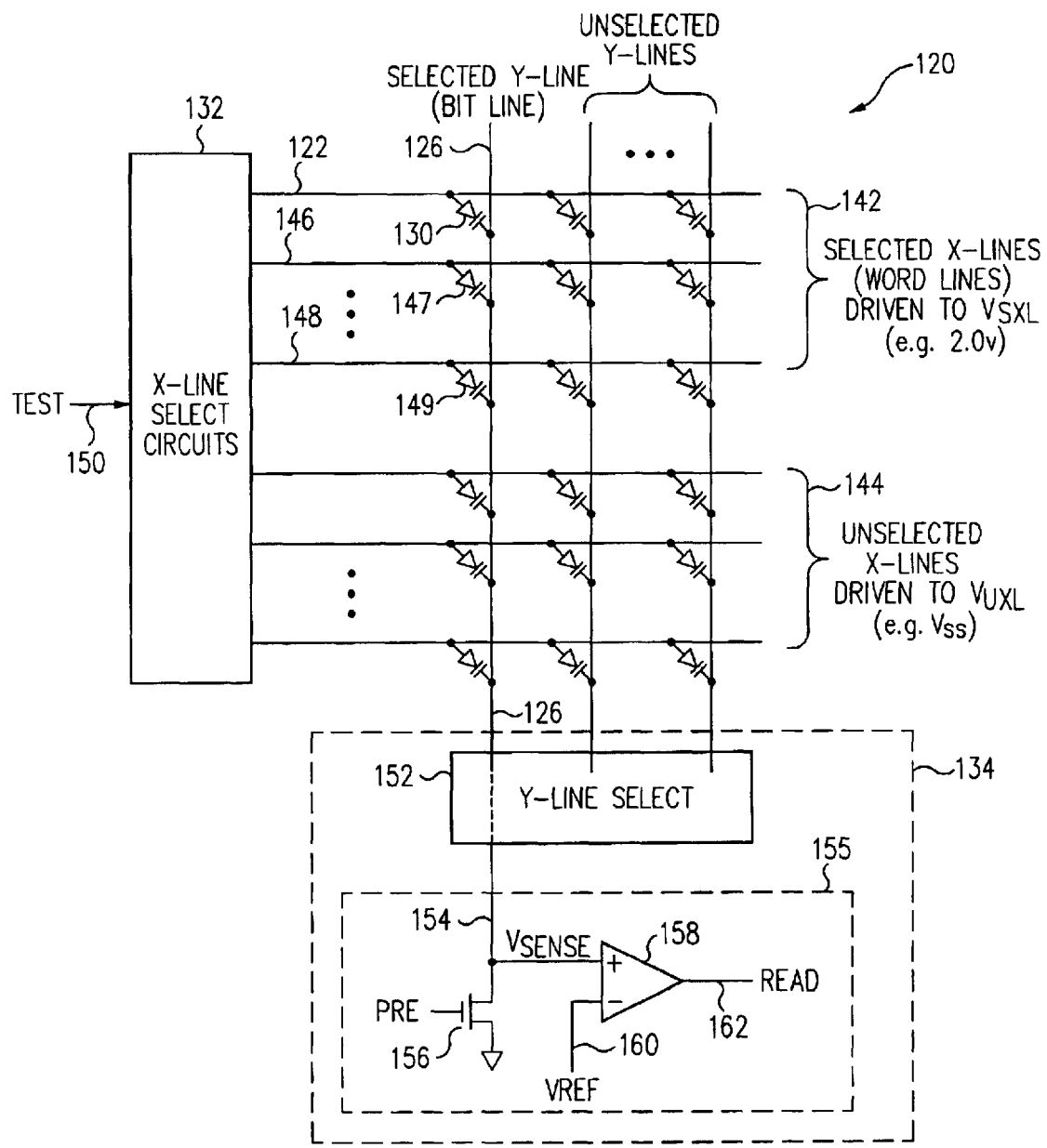
FIG. 3 is an electrical schematic diagram representing a passive element memory array, showing a group of selected X-lines, a group of unselected X-lines, and a selected Y-line, depicted during a test mode in accordance with the present invention.

Referring now to FIG. 3, a portion of the memory array 120 is shown. In particular, the selected Y-line 126 and internal portions of an exemplary Y-Line Select and Sense Circuit block 134 are depicted. In addition, the X-Line Select Circuits block 132 is shown, which receives a TEST signal conveyed on node 150. When the TEST signal is asserted, the X-Line Select Circuits block 132 simultaneously selects more than one X-line rather than just selecting one X-line as before. A group of selected X-lines 142 is shown, including the X-line 122 that would have been selected before (assuming the same 'row' or X-line address), as well as two additional selected X-lines 146 and 148. Each of the simultaneously selected X-lines is associated with the selected Y-line 126. Each respective memory cell that is coupled between a respective selected X-line and the selected Y-line is selected and potentially contributes current into the selected Y-line 126, which may be detected, as before, using normal read circuits within the Y-Line Select and Sense Circuit block 134.

In the example shown, the current flowing into the selected Y-line 126 is the sum of any current flowing from selected X-line 122 through selected memory cell 130, any current flowing from selected X-line 146 through selected memory cell 147, and any current flowing from selected X-line 148 through selected memory cell 149. If a "low total current" flows into the selected Y-line 126, then all selected memory cells are known to remain in a low-current state, and need not be individually addressed and sensed to determine such a condition. However, if the current into the selected Y-line 126 is a "high" current, then one or more selected memory cells is in a high current state, or a defect exists which allows such an excessive current to flow.

An exemplary Y-Line Select and Sense Circuit block 134 is depicted which includes a Y-line select block 152 coupling the selected Y-line 126 to a sense circuit 155. Suitable select blocks are well known in the art. Such a select block 152 may take a variety of suitable forms, and may be implemented as a portion of a bit line driver circuit configured to also drive its associated bit line, when unselected, to an unselected read bias voltage, and to other voltages during other times. An exemplary select block 152 receives a BLSELECT signal, such as from a column decoder (not shown). When the BLSELECT signal is active, the select block 152 couples its associated Y-line to a common node, such as sense node 154, serving a group of Y-lines, and when the BLSELECT is inactive, the select block 152 drives the Y-line to an unselected Y-line bias voltage $V_{UYL}$ (here shown as approximately +2.0 volts).

A precharge transistor 156 is momentarily activated by a precharge signal PRE to drive node 154 to ground, which also grounds the selected Y-line 126 through the Y-line select block 152. An amplifier 158 is configured to compare the voltage of node 154 to a reference voltage $V_{REF}$ and generate accordingly a read data signal READ on an output node 162. The value of the reference voltage $V_{REF}$ is preferably chosen to be near the mid-point between the voltage of a selected Y-line when pulled high through a selected memory cell (i.e., the bias voltage of a selected X-line less the voltage drop across a selected memory cell) and ground. An exemplary value of the $V_{REF}$ voltage is approximately 250 mV (for a selected X-line voltage $V_{SXL}$ of approximately 2.0 volts). If a significant current flows into the selected Y-line 126, the voltage of the selected Y-line 126 and the voltage of node 154 will increase to a voltage greater than the reference voltage $V_{REF}$ at which time the READ signal is driven high. If, alternatively, a negligible current flows into the selected Y-line 126, the voltage of the selected Y-line 126 and the voltage of node 154 will remain at or near ground (and particularly will remain below the reference voltage $V_{REF}$) and the READ signal will remain low.

Figure 4:
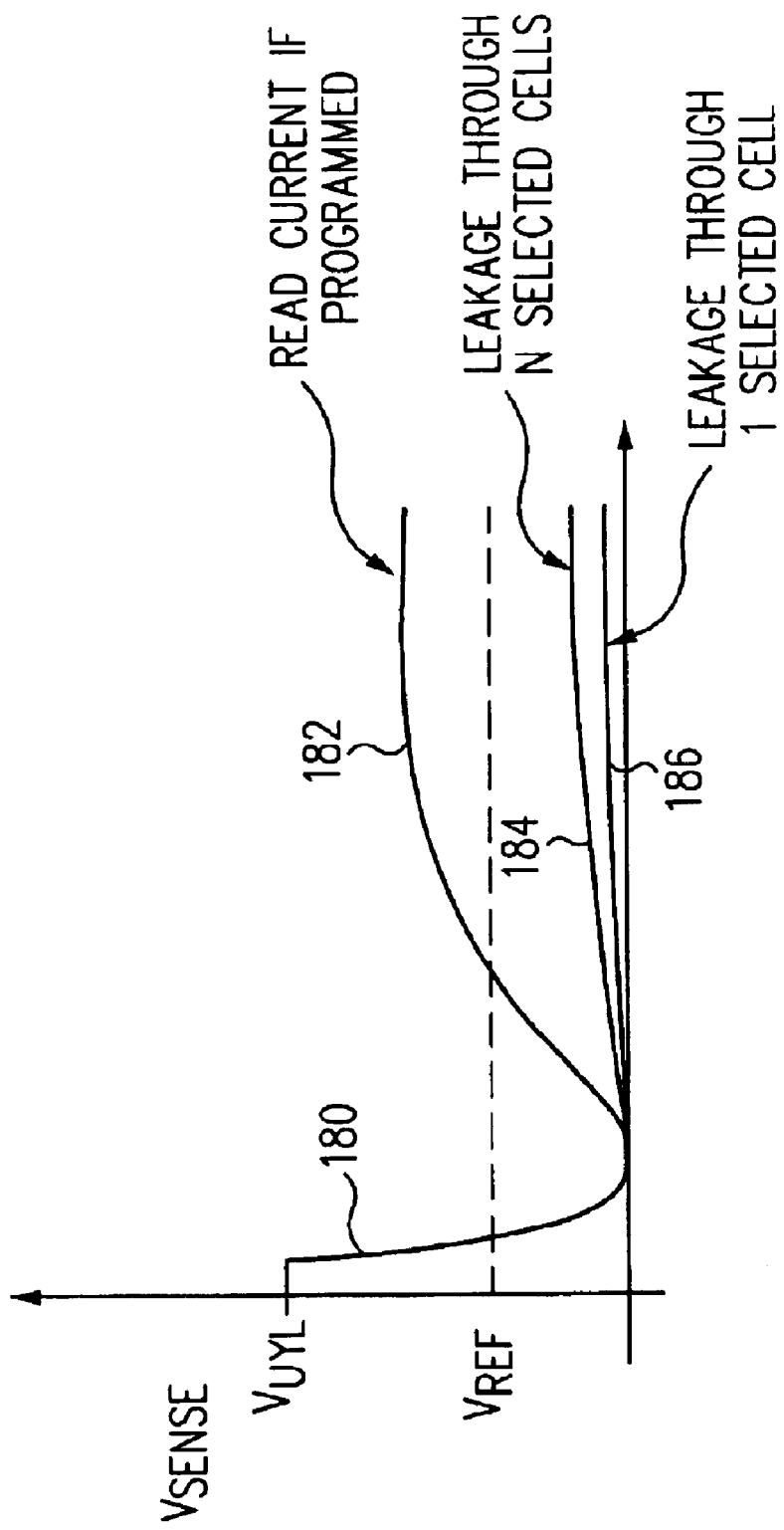
FIG. 4 is a waveform diagram of signals within the circuit depicted in FIG. 3.

Referring now to FIG. 4, a waveform plot is depicted to illustrate this operation. The voltage of the sense node 154 (i.e., $V_{SENSE}$) is plotted for each of several situations. Initially, the $V_{SENSE}$ voltage is discharged from an initial unselected Y-line voltage $V_{UYL}$ to ground by the precharge transistor 156, which is shown by curve 180. If one or more selected memory cells have been programmed, the read current causes the $V_{SENSE}$ voltage to increase well above the $V_{REF}$ voltage, as shown by curve 182. Alternatively, if all the selected memory cells remain unprogrammed and conduct only a leakage amount of current, the read current through N selected memory cells and into the selected Y-line 126 causes the $V_{SENSE}$ voltage to increase only slightly, thus remaining near ground, and in particular, below the $V_{REF}$ voltage, as shown by curve 184. In comparison, the read current through one selected memory cell (as would occur during a normal read mode operation when only one X-line is selected for a given selected Y-line) causes the $V_{SENSE}$ voltage to increase even less, thus remaining even closer to ground, as shown by curve 186.

Of significance, the same sense circuit normally used for reading a selected memory cell in the normal read mode may be used without modification when in the test mode to sense the plurality of simultaneously selected memory cells. Many suitable Y-line select block circuits and read or sense circuits may be employed as well, including various clamped bit line sense circuits, and including schemes incorporating noise detection lines, such as those described in U.S. application Ser. No. 09/896,468, entitled "Current Sensing Method and Apparatus Particularly Useful for a Memory Array of Cells Having Diode-Like Characteristics" by Scheuerlein, and in U.S. application Ser. No. 09/897,704, entitled "Memory Array Incorporating Noise Detection Line" by Scheuerlein, both of which are hereby incorporated by reference in their entirety. In some embodiments, it is advantageous to adjust a reference voltage, such as the $V_{REF}$ voltage conveyed on node 160, to a different value during the test mode than its value during the normal read mode, to provide more desirable margin testing, or to accommodate end of life parametric shifts in the semiconductor process, but in many embodiments no changes are otherwise needed in the read circuit. For example, in FIG. 4 the higher combined leakage current of N selected memory cells causes a higher voltage on the sense node 154 (shown as curve 184) than for a single selected memory cell (shown as curve 186). The magnitude of $V_{REF}$ may be adjusted upward to provide better margins for the higher anticipated bit line current during the test mode. It is also contemplated to use one or more sense circuits for the test mode which are separate from those used in the normal read mode.

Figure 5:
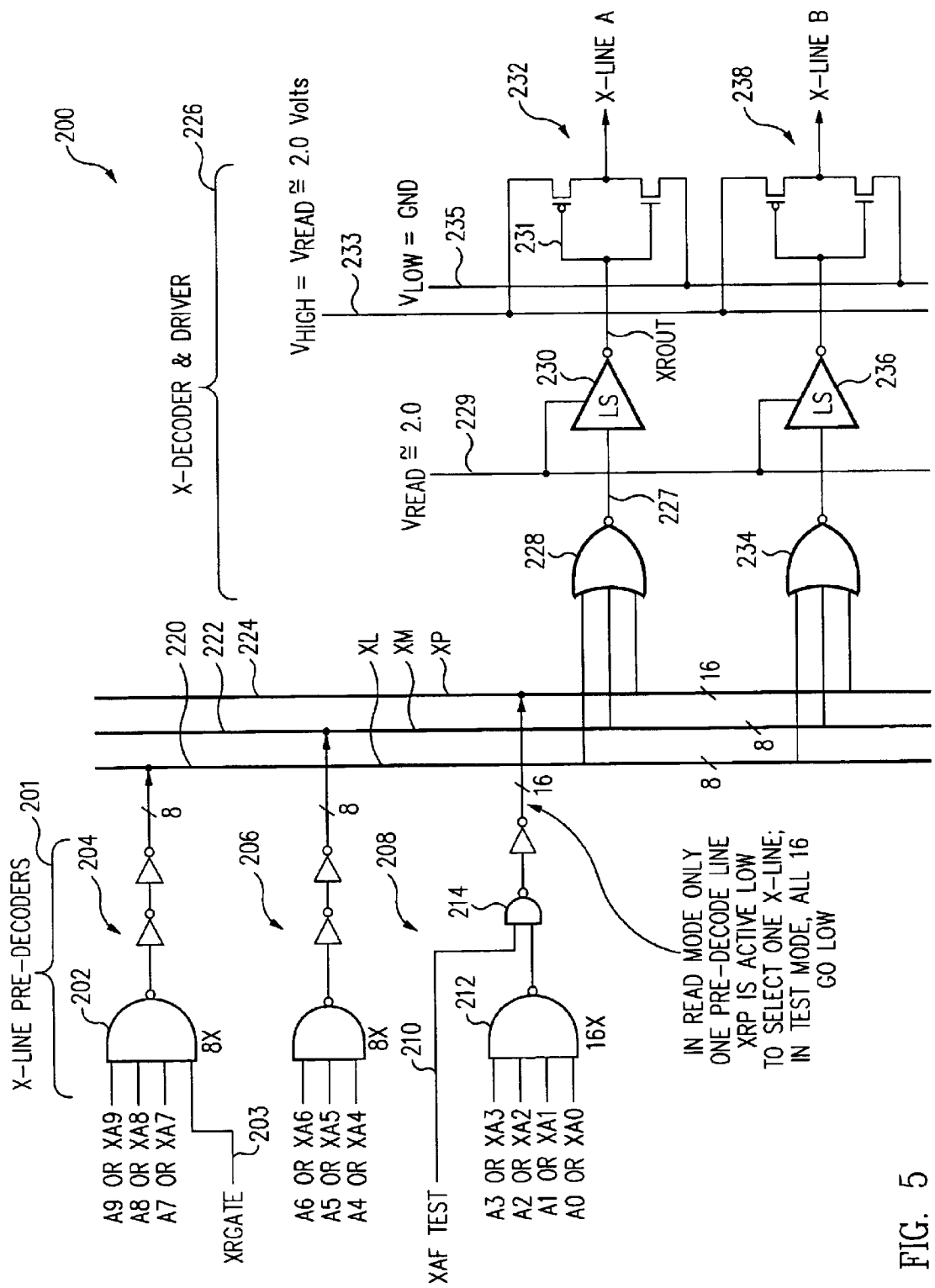
FIG. 5 is an electrical schematic diagram of an embodiment of row select circuits useful for the present invention.

Referring now to FIG. 5, an exemplary embodiment of a X-line select circuit 200 is depicted, which includes a plurality of pre-decoders 201 driving a plurality of decoder/drivers 226. The predecoders 201 are arranged to pre-decode three groups of addresses. Eight pre-decode circuits 204 are arranged to receive the eight combinations of three addresses A9, A8, and A7 and consequently generate a group of eight pre-decoded lines XL, a selected one of which is driven active low, and which collectively are conveyed on the XL pre-decode bus 220. Similarly, eight pre-decode circuits 206 are arranged to receive the eight combinations of addresses A6, A5, and A4 and consequently generate a group of eight pre-decoded lines XM, a selected one of which is driven active low, and which collectively are conveyed on the XM pre-decode bus 222. Lastly, sixteen pre-decode circuits 208 are arranged to receive the eight combinations of four addresses A3, A2, A1, and A0 and consequently generate a group of sixteen pre-decoded lines XP, a selected one of which is driven active low during the normal read mode of operation, and which collectively are conveyed on the XP pre-decode bus 224.

The three buses of pre-decoded lines XL, XM, and XP are conveyed to a plurality of row decoder/driver circuits 226, two of which are shown. It should be understood that in practice many more such circuits would normally be encountered in most useful embodiments. A first such row decoder for an X-line A is arranged to receive one of the eight XL lines, one of the eight XM lines, and one of the sixteen XP lines, each conveyed to decoder NOR gate 228 to generate a 1 of 1024 active high decoded signal on its output node 227. This signal is preferably buffered by a level translator 230 and driver 232 and conveyed to the X-line A. Both the level translator 230 and the driver 232 are configured to generate suitable bias voltages for at times reading and at other times writing passive element memory cells. As shown in the figure, the voltages are appropriate for the read mode and test mode of interest here. Specifically, a voltage conveyed on bus 229 to the level translator circuit 230 provides the output high level for the translator circuit, which in the read mode is preferably about 2.0 volts (for this exemplary embodiment). Similarly, the driver circuit 232 is arranged to receive the output 231 from the translator circuit 230, and accordingly drive its output (i.e., X-line A) to a high level equal to the voltage conveyed on bus 233 (also the $V_{READ}$ voltage of about 2.0 volts) or to a low level equal to the voltage conveyed on bus 235.

A second such row decoder for an X-line B is arranged to receive a different one of the eight XL lines, a different one of the eight XM lines, and a different one one of the sixteen XP lines, each conveyed to decoder NOR gate 234 to generate another 1 of 1024 active high decoded signal on its output node, which is buffered by level translator 236 and driver 238 to drive the X-line B. Other decoder and driver circuits may be employed, depending on the memory technology and the array configuration chosen. Useful word line circuits and configurations are described in "Three-Dimensional Memory Array Incorporating Serial Chain Diode Stack," application Ser. No. 09/897,705, filed on Jun. 29, 2001, and which is hereby incorporated by reference, and further described in "Memory Device with Row and Column Decoder Circuits Arranged in a Checkerboard Pattern under a Plurality of Memory Arrays," application Ser. No. 09/896,814, filed on Jun. 29, 2001, and which is hereby incorporated by reference.

In each of the sixteen pre-decoders 208, the pre-decode NAND gate 212 output is followed by a two-input NAND gate 214 rather than followed by just a buffer (as in the other two pre-decoders 204 and 206). In the test mode, an XAFTEST signal is asserted and conveyed on node 210 to the other input of this NAND gate 214 to inhibit or override the addresses otherwise pre-decoded. When XAFTEST is asserted, all sixteen pre-decode lines XP are driven low, and since these lines are active low, sixteen of the decoders 226 are selected rather than just one, and consequently sixteen X-lines are driven to the read voltage $V_{READ}$. In the pre-decoders 204, a gating signal XRGATE is provided which is asserted only after all address signals to the various pre-decoders have stabilized. By conveying this XRGATE signal to a fourth input of NAND gate 202, the selected one-of-eight XL predecode signals is asserted only after all other pre-decode signals have been properly decoded, and spurious row decodes in the row decoders 226 are avoided.

It should be appreciated that other similar configurations may achieve a greater or lesser number of simultaneously selected X-lines during the test mode. Moreover, other suitable techniques and circuits may be employed to simultaneously drive more than one X-line to a suitable read bias voltage. For example, a totally different driver circuit may be employed and the normal row decoder circuitry disabled. As another example, a row decoder circuit may be arranged with a shift-register style test mode decoder which sequentially shifts a test mode signal through a plurality of stages to select more than one (or all) such decoder outputs.

Using the example of sixteen simultaneously selected X-lines during the test mode as shown, such testing may be significantly accelerated. Referring back to FIG. 3, the READ signal conveyed on node 162 may be interrogated to assess sixteen memory cells at a time. Such a READ signal may be conveyed directly as an output signal, or another signal derived from the READ signal may instead be conveyed as an output to communicate the result. All the memory cells in the array may be tested by cycling through the non-inhibited addresses. In other embodiments 4, 8, 32, or 64 X-lines may be simultaneously selected.

Figure 6:
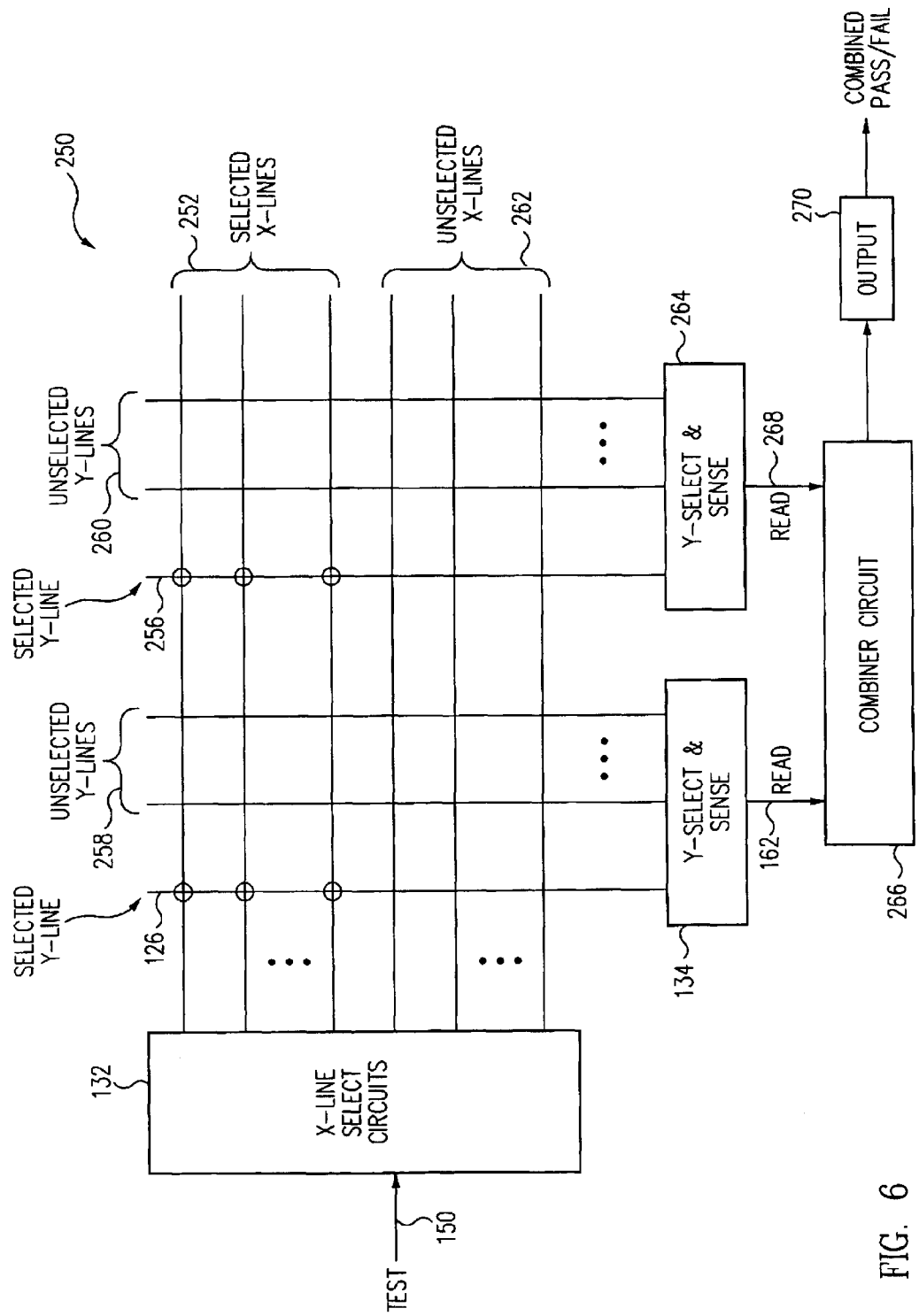
FIG. 6 is a block diagram showing a group of selected X-lines, and two selected Y-lines, depicted during a test mode in accordance with an embodiment of the present invention.

This concept may be extended by simultaneously selecting more than one Y-line associated with a group of selected X-lines in a sub-array. Referring now to FIG. 6, a sub-array 250 is depicted having two selected Y-lines 126 and 256 during the test mode. As before, the X-line select circuits block 132 receives a TEST signal to cause a plurality of X-lines 252 to be simultaneously selected, while a plurality of X-lines 262 remains unselected. The first selected Y-line 126 and a plurality of unselected Y-lines 258 are conveyed to a Y-select and sense circuit 132 which generates a READ signal on node 162, as before. In this embodiment, a second selected Y-line 256 and a second plurality of unselected Y-lines 260 are conveyed to a second Y-select and sense circuit 264 which generates a corresponding READ signal on node 268. These two read signals are combined in a combiner circuit 266 and buffered by an output circuit 270 to generate a single pass/fail signal as an output signal of the integrated circuit. Suitable combiner circuits include simple logic circuits which are well known in the art. Alternatively, both READ signals may be independently conveyed as two output signals. Additional selected Y-lines may be provided in a single sub-array, whose outputs may be combined into a smaller number of output signals, including down to just one such output signal for the entire sub-array.

Figure 7:
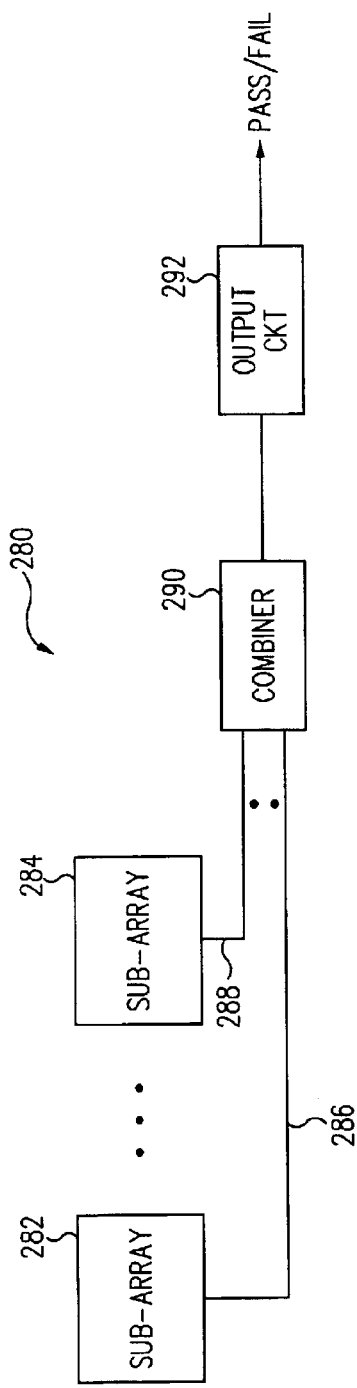
FIG. 7 is a block diagram showing a plurality of sub-arrays, each generating a read signal during a test mode which are combined into a single output signal.
Figure 8:
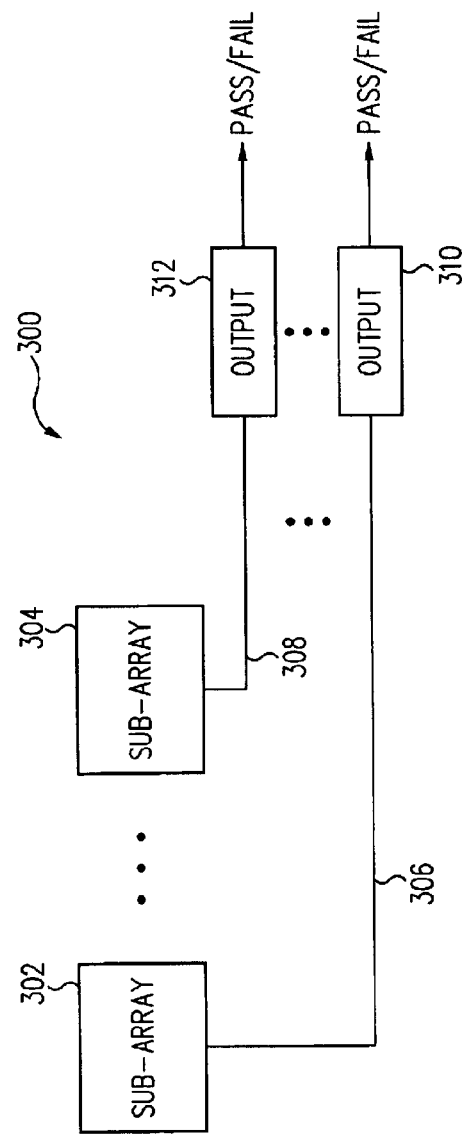
FIG. 8 is a block diagram showing a plurality of sub-arrays, each generating a read signal during a test mode which are respectively conveyed as independent output signals.

If a memory array is implemented as multiple sub-arrays, the concept may be further extended by operating each sub-array as described above, and combining one or more READ signals from each sub-array, or one or more signals derived from the READ signals from each array, into one or more output signals for the entire memory array. Referring now to FIG. 7, a block diagram is shown of a memory array 280 having a plurality of sub-arrays, each generating in the test mode a respective signal for indicating the test status of a selected group of memory cells associated with one or more selected Y-lines within the respective sub-array. Two sub-arrays 282 and 284 are depicted, although it should be understood that in practice many more such sub-arrays are usually implemented. Sub-arrays 282 and 284 generate respective read signals 286 and 288, which are combined in a block 290 and buffered by output circuit 292 to generate a single PASS/FAIL output signal. In FIG. 8, a memory array 300 is shown having a plurality of sub-arrays, each generating in the test mode a respective signal for indicating the test status of a selected group of memory cells associated with one or more selected Y-lines within the respective sub-array. In this embodiment, sub-arrays 302 and 304 generate respective read signals 306 and 308, which are independently buffered by respective output circuits 310 and 312 to generate respective PASS/FAIL output signals.

Figure 9:
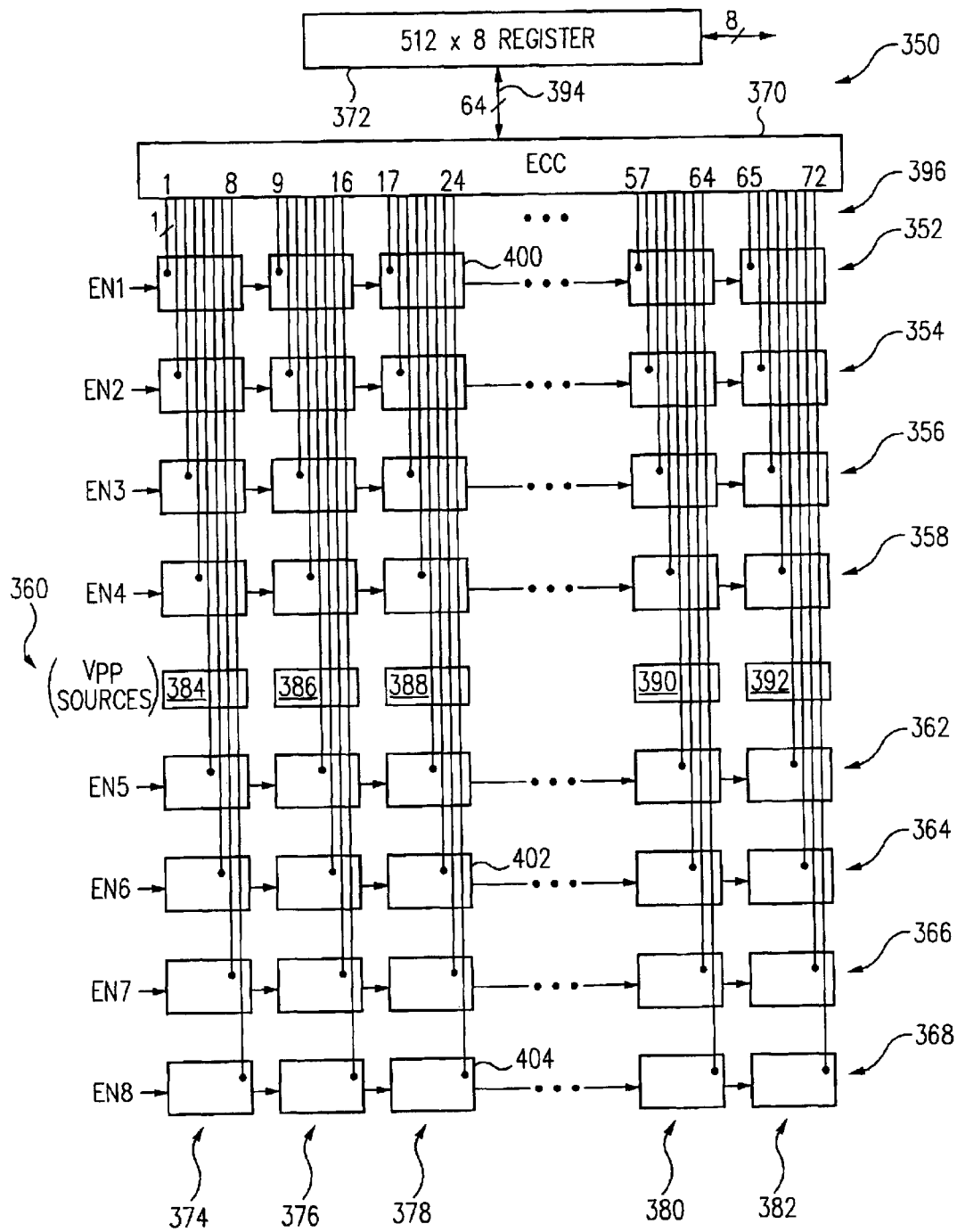
FIG. 9 is a block diagram of a useful arrangement of sub-arrays for use with certain embodiments of the present invention.

In a memory array implemented as a large number of sub-arrays, a significant decrease in test time may be accomplished if such a test mode is carried out in a large number of such sub-arrays. For example, in an exemplary embodiment of an integrated circuit including a three-dimensional write-once memory array, the memory array is divided into 72 sub-arrays as shown in FIG. 9. Eight error correction check/syndrome bits are concatenated to each 64 bit data word to generate a 72-bit ECC data word. Preferably each bit of this 72-bit ECC data word is written physically into a different corresponding one of the 72 sub-arrays. Additional details of this exemplary embodiment are described in commonly-assigned, co-pending U.S. patent application Ser. No. 09/747,574 entitled "Three-Dimensional Memory Array and Method for Storing Data Bits and ECC Bits Therein," filed on Dec. 22, 2000, naming Thomas H. Lee, James M. Cleeves, and Mark G. Johnson as inventors, which application is hereby incorporated by reference in its entirety, and further described in commonly-assigned, co-pending U.S. patent application Ser. No. 09/748,649, entitled "Partial Selection of Passive Element Memory Cell Sub-Arrays for Write Operation," filed on Dec. 22, 2000, naming Roy E. Scheuerlein and Matthew P. Crowley as inventors, which application is hereby incorporated by reference in its entirety.

In such an exemplary arrangement, a READ signal from each respective memory sub-array is preferably conveyed in parallel to the ECC block 370, which translates the information to a 64-bit output word conveyed on bus 392 to the register 372, and then read out using existing output circuitry and output drivers. Other numbers of sub-arrays are contemplated for use with an ECC circuit. For example, two bits of each 72-bit ECC word may be stored respectively into each of 36 sub-arrays. In a test mode as described above, 36 sub-arrays may be simultaneously selected, with 16 sense circuits (i.e., Y-lines) simultaneously selected in each sub-array. Other suitable arrangements are numerous, and the particular embodiments described only illustrative of the many ways that the invention may be implemented in an integrated circuit having a plurality of sub-arrays.

As more fully described in U.S. Pat. No. 6,034,882, each sub-array of an exemplary embodiment preferably includes a row select block on the left side of the sub-array to support half of the word lines (i.e., every other one), and further includes a row select block 184 on the right side of the sub-array to support the remaining half of the word lines. It should be appreciated that the designations top, left, bottom, and right are merely convenient descriptive terms for the four sides of a memory array. Two interdigitated groups of X-lines are oriented horizontally in the array, and two interdigitated groups of Y-lines are oriented vertically in the array. Each respective group of X-lines or Y-lines is preferably served by a respective decoder/driver circuit and a respective sense circuit on one of the four sides of the array. Preferred embodiments for row and column circuitry serving a plurality of memory sub-arrays, which embodiments are useful alone or in combination with any of the preferred embodiments described herein, are set forth in "Memory Device with Row and Column Decoder Circuits Arranged in a Checkerboard Pattern under a Plurality of Memory Arrays," by Roy E. Scheuerlein, U.S. patent application Ser. No. 09/896,814, filed on Jun. 29, 2001, and which application is hereby incorporated by reference.

Figure 10:
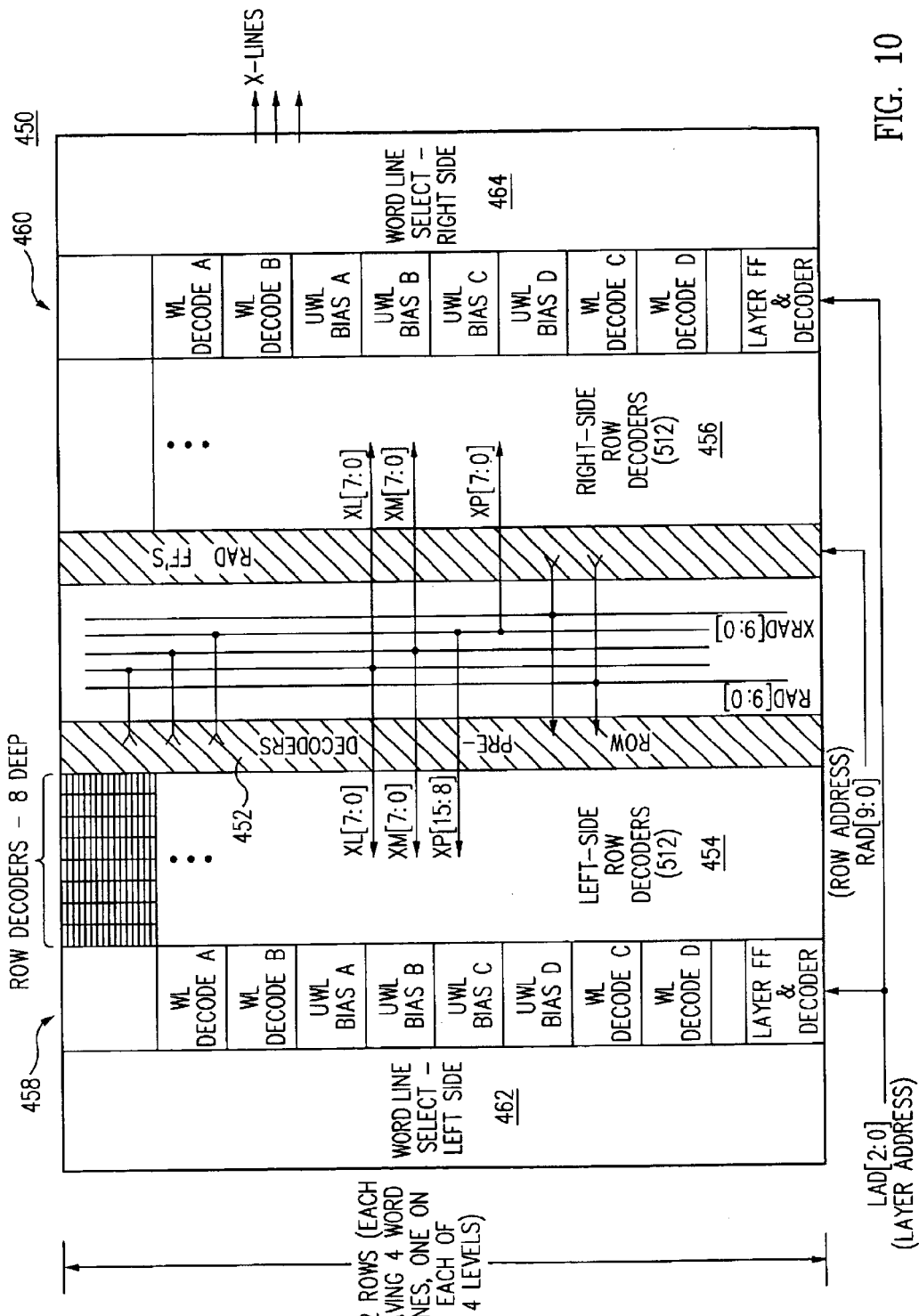
FIG. 10 is a block diagram depicting a preferred arrangement of various row select circuits for a particular sub-array.

Referring now to FIG. 10, a block diagram of a preferred integrated circuit layout 450 is depicted which shows an exemplary configuration of the various row select circuits for a sub-array, and which are preferably implemented in the substrate below the sub-array. As shown, the pre-decoders 201 are arranged vertically near the center of the area, labeled 452. The three groups pre-decoded lines XL, XM, and XP are generated by the pre-decoders and are routed vertically from top to bottom of the area below the sub-array. Both the XL and XM pre-decode lines traverse both to the left and right to convey their respective pre-decoded address information to both a left-side group of row decoder circuits 454 and right-side group of row decoders 456. But the XP pre-decode lines are split, with eight (e.g., XP[15:8]) traversing to the left side row decoder circuits 454, and the remaining eight (e.g., XP[7:0]) traversing to the right-side row decoder circuits 456. A left-side group of bias generators 458 for read and write modes, and a group of X-line drivers 462, are disposed outward of the left-side row decoders 454. A right-side group of read and write bias generators 460, and a group of X-line drivers 464, are disposed outward of the right-side row decoders 456. In this fashion, the word lines (i.e., X-lines) are inter-digitated, with even-numbered word lines driven from one side of the sub-array and odd-numbered word lines driven from the other side. With half the XP pre-decode lines routed to each side, the group of sixteen simultaneously selected X-lines in the test mode may be configured to be contiguous X-lines within the sub-array. This is helpful in locating defects that are spatially correlated (e.g., defects that "clump"). Additional details of bias circuits and layer decoder circuits particularly suitable for a three-dimensional memory array of write-once anti-fuse passive element memory cells are described in U.S. application Ser. No. 09/897,771, entitled "Method and Apparatus for Biasing Selected and Unselected Array Lines When Writing a Memory Array", by Roy E. Scheuerlein, and in "Three-Dimensional Memory Array Incorporating Serial Chain Diode Stack" by Kleveland, et al, U.S. patent application Ser. No. 09/897,705, filed on Jun. 29, 2001, which are both hereby incorporated by reference in their entirety.

As used herein, a passive element memory array includes a plurality of 2-terminal memory cells, each connected between an associated X-line and an associated Y-line. Such a memory array may be planar or may be a three-dimensional array having more than one plane of memory cells. Each such memory cell has a non-linear conductivity in which the current in a reverse direction (i.e., from cathode to anode) is lower than the current in a forward direction. Application of a voltage from anode to cathode greater than a programming level changes the conductivity of the memory cell. The conductivity may decrease when the memory cell incorporates a fuse technology, or may increase when the memory cell incorporates an antifuse technology. A passive element memory array is not necessarily a one-time programmable (i.e., write once) memory array.

Word lines may also be referred to as row lines or X-lines, and bit lines may also be referred to as column lines or Y-lines. The distinction between "word" lines and "bit" lines may carry at least two different connotations to those skilled in the art. When reading a memory array, it is assumed by some practitioners that word lines are "driven" and bit lines are "sensed." In this regard, X-lines (or word lines) are frequently, but not always, connected to the anode terminal of the memory cells, and Y-lines (or bit lines) are frequently, but not always, connected to the cathode terminal of the memory cells. Secondly, the memory organization (e.g., data bus width, number of bits simultaneously read during an operation, etc.) may have some association with viewing one set of the two array lines more aligned with data "bits" rather than data "words."

The embodiments described may show a selected word line being driven to a voltage and a selected bit line being sensed, and memory cell anode terminals connected to word lines and cathode terminals connected to bit lines, but other embodiments are specifically contemplated. For example, in a multi-level memory array, an adjacent memory plane may be connected similarly (e.g., a back-to-back diode stack memory array), or may reverse the directionality of memory cells in the adjacent plane (e.g., a serial chain diode stack memory array) so that the anode terminals are connected to bit lines and the cathode terminals to word lines. Consequently, the designations herein of X-lines, word lines, and row lines, and of Y-lines, bit lines, and column lines are illustrative of the various embodiments but should not be viewed in a restrictive sense, but rather a more general sense. For example, the sensing circuits described herein may be coupled to word lines rather than bit lines, or may be used for both word lines and bit lines, when sensing a current in a word line rather than in a bit line. Such organizations (and others) are described in "Three-Dimensional Memory Array Incorporating Serial Chain Diode Stack" by Kleveland, et al, U.S. patent application Ser. No. 09/897,705, filed on Jun. 29, 2001, and which application is hereby incorporated by reference.

The directionality of X-lines (shown horizontally in the various figures) and Y-lines (shown vertically) is merely convenient for ease of description of the two groups of crossing lines in the array. While X-lines are usually orthogonal to Y-lines, such is not necessarily implied by such terminology. Moreover, the word and bit organization of a memory array may also be easily reversed, having Y-lines organized as word lines and X-lines organized as bit lines. As an additional example, portions of an array may correspond to different output bits of a given word. Such various array organizations and configurations are well known in the art, and the invention in intended to comprehend a wide variety of such variations.

The block diagrams herein may be described using the terminology of a single node connecting the blocks. Nonetheless, it should be appreciated that, when required by the context, such a "node" may actually represent a pair of nodes for conveying a differential signal, or may represent multiple separate wires (e.g., a bus) for carrying several related signals or for carrying a plurality of signals forming a digital word or other multi-bit signal.

Based upon the teachings of this disclosure, it is expected that one of ordinary skill in the art will be readily able to practice the present invention. The descriptions of the various embodiments provided herein are believed to provide ample insight and details of the present invention to enable one of ordinary skill to practice the invention. Although certain supporting circuits (e.g., decoders, drivers, switches, multiplexers, input/output buffers, etc.) are not specifically described, such circuits are well known, and no particular advantage is afforded by specific variations of such circuits in the context of practicing this invention. Moreover, it is believed that one of ordinary skill in the art, equipped with the teaching of this disclosure, will be able to carry out the invention, including implementing various control circuits inferred but not specifically described herein, using well known circuit techniques and without undue experimentation.

Preferably, the memory cells are comprised of semiconductor materials, as described in U.S. Pat. No. 6,034,882 to Johnson et al., U.S. Pat. No. 5,835,396 to Zhang, U.S. patent application Ser. No. 09/560,626 to Knall, and U.S. patent application Ser. No. 09/638,428 to Johnson, et al., each of which are hereby incorporated by reference. Specifically an antifuse memory cell is preferred. Other types of memory arrays, such as MRAM and organic passive element arrays, can also be used. MRAM (magnetoresistive random access memory) is based on magnetic memory elements, such as a magnetic tunnel junction (MTJ). MRAM technology is described in "A 2556 kb 3.0V ITIMTJ Nonvolatile Magnetoresistive RAM" by Peter K. Naji et al., published in the Digest of Technical Papers of the 2001 IEEE International Solid-State Circuits Conference, ISSCC 2001/Session 7/Technology Directions: Advanced Technologies/7.6, Feb. 6, 2001 and pages 94–95, 404–405 of ISSCC 2001 Visual Supplement, both of which are hereby incorporated by reference. Certain passive element memory cells incorporate layers of organic materials including at least one layer that has a diode-like characteristic conduction and at least one organic material that changes conductivity with the application of an electric field. U.S. Pat. No. 6,055,180 to Gudensen et al, describes organic passive element arrays and is also hereby incorporated by reference. Memory cells comprising materials such as phase-change materials and amorphous solids can also be used. See U.S. Pat. No. 5,751,012 to Wolstenholme et al, and U.S. Pat. No. 4,646,266 to Ovshinsky et al., both of which are hereby incorporated by reference. In other embodiments, three-terminal memory cells may also be employed, rather than two-terminal passive element memory cells, and multiple X-lines (or row lines) selected to sum currents from more than one memory cell on a selected Y-line (or bit line). Such memory cells include flash EPROM and EEPROM cells, which are well known in the art.

It will be appreciated by one skilled in the art that any of several expressions may be equally well used when describing the operation of a circuit including the various signals and nodes within the circuit, and no subtle inferences should be read into varied usage within this description. A logic signal has an active level (i.e., active state) and an inactive level (at least for traditional binary logic signals). The active level for some logic signals is a high level (i.e., an "active-high" signal) and for others is a low level (i.e., an "active-low" signal). A logic signal is "asserted" or "activated" when driven to its active level. Conversely, a logic signal is "de-asserted" or "de-activated" when driven to its inactive level. A high logic level is frequently referred to as a logic "1" and a low logic level is frequently referred to as a logic "0" (at least for positive logic). Frequently logic signals are named in a fashion to convey which level is the active level. The schematic diagrams and accompanying description of the signals and nodes should in context be clear.

The foregoing details description has described only a few of the many possible implementations of the present invention. For this reason, this detailed description is intended by way of illustration, and not by way of limitations. Variations and modifications of the embodiments disclosed herein may be made based on the description set forth herein, without departing from the scope and spirit of the invention. It is only the following claims, including all equivalents, that are intended to define the scope of this invention. In particular, even though the preferred embodiments are described in the context of a passive element memory array, the teachings of the present invention are believed advantageous for use with other types of memory cells, such as certain 3-terminal memory cells. While certain embodiments have been described in the context of a three-dimensional, field-programmable, write once memory array, it should be appreciated that such an array is not necessarily required Moreover, the embodiments described above are specifically contemplated to be used alone as well as in various combinations. Accordingly, other embodiments, variations, and improvements not described herein are not necessarily excluded from the scope of the invention.

What is claimed is:

1. In an integrated circuit having a fully-decoded array of memory cells, each memory cell associated with one of a plurality of X-lines and one of a plurality of Y-lines, a method of operating the memory array comprising the steps of:

selecting at least a first Y-line;

in a first mode of operation, selecting an X-line associated with the first selected Y-line to impress a read bias across a corresponding memory cell coupled between the selected X-line and the first selected Y-line;

in a second mode of operation:

selecting a first plurality of X-lines associated with the first selected Y-line to impress a read bias across each of a corresponding first plurality of selected memory cells respectively coupled between the first plurality of selected X-lines and the first selected Y-line;

enabling a first read circuit having an input coupled to the first selected Y-line; and generating a first read signal on an output of the first read circuit having a first value if an aggregate read current of the first plurality of selected memory cells exceeds a second mode threshold level.

2. The invention defined by claim 1 further comprising the steps of:

in the first mode of operation:

enabling the first read circuit; and generating the first read signal on the output of the first read circuit having the first value if a read current of the selected memory cell exceeds a first mode threshold level, and otherwise having a second value opposite the first value.

3. The invention defined by claim 2 wherein:

the second mode threshold level is different than the first mode threshold level.

4. The invention defined by claim 1 further comprising the steps of:

in the first mode of operation, enabling another read circuit other than the first read circuit, having an input coupled to the first selected Y-line; and generating a read signal on an output of the other read circuit having a first value if a read current of the selected memory cell exceeds a first mode threshold level, and otherwise having a second value opposite the first value.

5. The invention defined by claim 4 wherein:
the second mode threshold level is different than the first mode threshold level.

6. The invention defined by claim 1 further comprising:
in the second mode of operation, generating an output signal derived at least from the first read signal.

7. The invention defined by claim 1 further comprising the steps of:
in the second mode of operation:
  selecting a second Y-line;
  selecting a second plurality of X-lines associated with the second selected Y-line to impress a read bias across each of a corresponding second plurality of selected memory cells respectively coupled between the second plurality of selected X-lines and the second selected Y-line;
  enabling a second read circuit having an input coupled to the second selected Y-line; and
  generating a second read signal on an output of the second read circuit having a first value if an aggregate read current of the second plurality of selected memory cells exceeds a threshold level.

8. The invention defined by claim 7 wherein:
the first and second selected Y-lines are disposed in a single sub-array of the memory array.

9. The invention defined by claim 8 wherein:
the first and second plurality of selected X-lines are identical.

10. The invention defined by claim 7 wherein:
the first and second selected Y-lines are disposed in separate sub-arrays of the memory array.

11. The invention defined by claim 7 further comprising the steps of:
in the second mode of operation:
  generating an output signal for indicating whether at least one of the first and second read signals is at its respective first value.

12. The invention defined by claim 7 further comprising the steps of:
in the second mode of operation:
  generating an output signal having a first value if either one or both of the first and second read signals are at their respective first values, and having a second value otherwise.

13. The invention defined in claim 1 wherein:
the read bias in the first mode of operation is substantially the same as in the second mode of operation.

14. In an integrated circuit having a fully-decoded array of passive element memory cells, each memory cell comprising an anti-fuse and associated with one of a plurality of X-lines and one of a plurality of Y-lines, a method of operating the memory array comprising the steps of:
  selecting at least a first Y-line;
  in a first mode of operation, selecting an X-line associated with the first selected Y-line to impress a read bias across a corresponding memory cell coupled between the selected X-line and the first selected Y-line;
  in a second mode of operation, selecting a first plurality of X-lines associated with the first selected Y-line to impress a read bias across each of a corresponding first plurality of selected memory cells respectively coupled between the first plurality of selected X-lines and the first selected Y-line;
  in both the first and second modes of operation:
    enabling a first read circuit having an input coupled to the first selected Y-line;
    generating a first read signal on an output of the first read circuit having a first value if an aggregate read current through the one or more selected memory cells exceeds a respective threshold level; and
    generating an output signal derived at least from the first read signal.

15. The invention defined by claim 14 wherein:
the threshold level for the second mode of operation is different than for the first mode of operation.

16. The invention as recited in claim 14 wherein the step of selecting a first plurality of X-lines includes:
  over-riding at least one address signal to cause an X-line decoder circuit to simultaneously select more than one X-line.

17. The invention defined by claim 14 further comprising the steps of:
in the second mode of operation:
  selecting a second Y-line;
  selecting a second plurality of X-lines associated with the second selected Y-line to impress a read bias across each of a corresponding second plurality of selected memory cells respectively coupled between the second plurality of selected X-lines and the second selected Y-line;
  enabling a second read circuit having an input coupled to the second selected Y-line; and
  generating a second read signal on an output of the second read circuit having a first value if an aggregate read current through the second plurality of selected memory cells exceeds the second mode threshold level.

18. The invention defined by claim 17 wherein:
the first and second selected Y-lines are disposed in separate sub-arrays of the memory array.

19. The invention defined by claim 17 further comprising the steps of:
in the second mode of operation:
  generating an output signal having a first value if either one or both of the first and second read signals are at their respective first values, and having a second value if both the first and second read signals are at their respective second values.

20. The invention defined by claim 17 wherein:
the first and second selected Y-lines are disposed in a first sub-array of the memory array; and
the first and second plurality of selected X-lines are identical.

21. The invention defined by claim 20 further comprising the steps of:
in the second mode of operation:
  selecting a third Y-line disposed in a second sub-array of the memory array different than the first sub-array;
  selecting a third plurality of X-lines associated with the third selected Y-line to impress a read bias across each of a corresponding third plurality of selected memory cells respectively coupled between the third plurality of selected X-lines and the third selected Y-line;
  enabling a third read circuit having an input coupled to the third selected Y-line; and
  generating a third read signal on an output of the third read circuit having a first value if an aggregate read circuit through the third plurality of selected memory cells exceeds the second mode threshold level.

22. The invention defined by claim 21 further comprising the steps of:
  in the second mode of operation:
    generating an output signal for indicating whether at least one of the first, second, and third read signals is at its respective first value.

23. The invention defined by claim 21 further comprising the steps of:
  in the second mode of operation:
    generating a first output signal for indicating whether at least one of the first and second read signals is at its respective first value; and
    generating a second output signal for indicating whether at least the third read signal is at its respective first value.

24. In an integrated circuit having a fully-decoded array of memory cells, each memory cell associated with one of a plurality of X-lines and one of a plurality of Y-lines, a method of operating the memory array comprising the steps of:
  simultaneously selecting a plurality of memory cells arranged in at least one group of memory cells;
  determining whether a read current greater than a particular value flows collectively through the selected memory cells in each respective group;
  generating one or more output signals numbering less than the number of simultaneously selected memory cells, each respective output signal for indicating whether a read current greater than the particular value flows through one or more selected memory cells of each group of memory cells respectively associated therewith.

25. The invention defined by claim 24 wherein:
  each memory cell of a respective group of memory cells is associated with a respective Y-line.

26. The invention defined by claim 24 wherein:
  at least one output signal represents memory cells of more than one group.

27. The invention defined by claim 24 wherein:
  at least one output signal represents memory cells of a single group.

28. The invention defined by claim 24 wherein:
  the output signals number less than the number of groups; and
  each output signal represents memory cells of more than one group.

29. An integrated circuit comprising:
  a fully-decoded array of memory cells, each memory cell coupled to one of a plurality of X-lines and one of a plurality of Y-lines, wherein each Y-line is associated with a plurality of X-lines by virtue of the memory cells respectively coupled therebetween;
  an X-line circuit for selecting, in a first mode of operation, an X-line associated with a first selected Y-line to impress a read bias across a corresponding memory cell coupled between the selected X-line and the first selected Y-line, and for selecting, in a second mode of operation, a first plurality of X-lines associated with the first selected Y-line to impress a read bias across each of a corresponding first plurality of selected memory cells respectively coupled between the first plurality of selected X-lines and the first selected Y-line;
  a first read circuit for determining, in at least the second mode of operation, whether an aggregate read current of the first plurality of selected memory cells coupled to the first selected Y-line exceeds a second mode threshold level of current, and for generating a first read signal accordingly.

30. The invention defined by claim 29 wherein:
  the first read circuit is configured for determining, in the first mode of operation, whether a read current of the selected memory cell coupled to the selected Y-line exceeds a first mode threshold level of current.

31. The invention defined by claim 30 wherein:
  the threshold level of current for the first read circuit in the second mode of operation is different than for the first mode of operation.

32. The invention defined by claim 29 further comprising:
  another read circuit different than the first read circuit for determining, in the first mode of operation, whether a read current of the selected memory cell coupled to the selected Y-line exceeds a first mode threshold level of current.

33. The invention defined by claim 32 wherein:
  the threshold level of current for the first read circuit in the second mode of operation is different than the threshold level of current for the other read circuit in the first mode of operation.

34. The invention defined by claim 29 further comprising:
  an output circuit responsive to at least the first read signal, for conveying an output signal derived at least from the first read signal.

35. The invention defined by claim 29 further comprising:
  a second X-line circuit for selecting, in the second mode of operation, a second plurality of X-lines associated with a second selected Y-line to impress a read bias across each of a corresponding second plurality of selected memory calls respectively coupled between the second plurality of selected X-lines and the second selected Y-line; and
  a second read circuit for determining, in at least the second mode of operation, whether an aggregate read current of the second plurality of selected memory cells coupled to the second selected Y-line exceeds a second mode threshold level of current, and for generating a second read signal accordingly.

36. The invention defined by claim 35 wherein:
  the first and second selected Y-lines are disposed in a single sub-array of the memory array.

37. The invention defined by claim 36 wherein:
  the first and second plurality of selected X-lines are identical.

38. The invention defined by claim 35 wherein:
  the first and second selected Y-lines are disposed in separate sub-arrays of the memory array.

39. The invention defined by claim 35 further comprising:
  a combining circuit responsive to at least the first and second read signals, for conveying an output signal derived at least from the first and second read signals.

40. The integrated circuit defined by claim 29 wherein:
  each memory cell comprises a passive element memory cell including an anti-fuse;
  the X-line circuit comprises a first X-line circuit;
  the first mode of operation comprises a read mode of operation;
  the second mode of operation comprises a test mode of operation;
  the first read circuit is for determining, in both the read and test modes of operation, whether an aggregate read current of the one or more selected memory cells coupled to the first selected Y-line exceeds a respective threshold level of current, and for generating the first read signal accordingly;

said integrated circuit further comprising an output circuit coupled to receive at least the first read signal, for generating an output signal derived from at least the first read signal.

41. The invention defined by claim 40 wherein:

the threshold level of current for the test mode of operation is different than for the read mode of operation.

42. The invention as recited in claim 40 wherein the X-line circuit includes:

means for inhibiting at least one address signal to cause an X-line decoder circuit to simultaneously select more than one X-line.

43. The invention defined by claim 40 further comprising:

a second X-line circuit for selecting, in the second mode of operation, a second plurality of X-lines associated with a second selected Y-line to impress the read bias across each of a corresponding second plurality of selected memory cells respectively coupled between the second plurality of selected X-lines and the second selected Y-line; and a second read circuit for determining, in at least the test mode of operation, whether an aggregate read current of the second plurality of selected memory cells coupled to the second selected Y-line exceeds the test mode threshold level of current, and for generating a second read signal accordingly;

wherein the first and second selected Y-lines are disposed in separate sub-arrays of the memory array.

44. The invention defined by claim 40:

wherein the first plurality of X-lines associated with the first selected Y-line are also associated with a second selected Y-line disposed with the first selected Y-line in a single sub-array of the memory array, said first X-line circuit also for impressing, during the test mode of operation, the read bias across each of a corresponding second plurality of selected memory cells respectively coupled between the first plurality of selected X-lines and the second selected Y-line; and further comprising a second read circuit for determining, in at least the test mode of operation, whether an aggregate read current of the second plurality of selected memory cells coupled to the second selected Y-line exceeds a threshold level of current, and for generating a second read signal accordingly.

45. The invention defined by claim 40 wherein the first X-line circuit comprises:

a decoder circuit configurable during the read mode to select one of the plurality of X-lines by decoding a first group of address signals, and configurable during the test mode to select more than one of the plurality of X-lines by inhibiting a portion of the first group of address signals and decoding the remaining non-inhibited portion.

46. The invention defined by claim 45 wherein:

the inhibited portion represent contiguous low-order addresses, and the selected first plurality of X-lines during the test mode are contiguous in the memory array.

47. The invention defined by claim 40 wherein:

the memory array comprises a three-dimensional memory array having at least two planes of memory cells, each memory cell of a given plane coupled to one of a plurality of X-lines associated with the given plane and further coupled to one of a plurality of Y-lines associated with the given plane, wherein each Y-line is associated with a plurality of X-lines by virtue of the memory cells respectively coupled therebetween.

48. The invention defined by claim 47 wherein:

the first X-line circuit is configurable during the test mode to select at least one of a plurality of first layer X-lines associated with the first selected Y-line, and to select at least one of a plurality of second layer X-lines also associated with the first selected Y-line.

49. The invention defined by claim 47 wherein:

the first X-line circuit is configurable during the test mode to select at least one X-line associated with a respective one of two adjacent memory planes, each such selected X-line being also associated with the first selected Y-line.

50. An integrated circuit comprising:

a fully-decoded memory array of memory cells, each memory cell coupled to one of a plurality of X-lines and one of a plurality of Y-lines, wherein each Y-line is associated with a plurality of X-lines by virtue of the memory cells respectively coupled therebetween;

means for simultaneously selecting a plurality of memory cells arranged in at least one group of memory cells;

means for determining whether an aggregate read current greater than a particular value flows through the selected memory cells in each respective group;

means for generating one or more output signals numbering less than the number of simultaneously selected memory cells, each respective output signal for indicating whether a read current greater than the particular value flows through one or more selected memory cells of each group of memory cells respectively associated therewith.

51. The invention defined by claim 50 wherein:

each memory cell of a respective group of memory cells is associated with a respective Y-line.

52. The invention defined by claim 50 wherein:

at least one output signal represents memory cells of more than one group.

53. The invention defined by claim 50 wherein:

at least one output signal represents memory cells of a single group.

54. The invention defined by claim 50 wherein:

the output signals number less than the number of groups; and each output signal represents memory cells of more than one group.

55. A method for testing a fully-decoded memory array of programmable memory cells, the method comprising the steps of:

(a) identifying a maximum acceptable value of read current that would result from applying a given voltage across a defined group of unprogrammed memory cells;

(b) applying the given voltage across a first group of memory cells to be tested;

(c) sensing a current through the first group of memory cells from step (b); and (d) comparing the current of step (c) with the value of step (a).

56. The invention defined by claim 55 further comprising the steps of:

(e) applying the given voltage across a second group of memory cells to be tested;

(f) sensing a current through the second group of memory cells from step (e); and (g) comparing the current of step (f) with the value of step (a).

57. The invention defined by claim 56 wherein:

the first and second groups of memory cells are disposed in a single sub-array of the memory array.

58. The invention defined by claim 56 wherein:

the first and second groups of memory cells are disposed in separate sub-arrays of the memory array.

59. The invention defined by claim 55 further comprising the steps of:

generating an output signal to communicate the comparison of step (d).

60. The invention defined by claim 56 further comprising the steps of:

generating an output signal to jointly communicate the comparison of step (d) and the comparison of step (f).

61. The invention defined by claim 55 wherein:

the programmable memory cells comprise passive element memory cells.

62. The invention defined by claim 61 wherein:

the passive element memory cells comprise antifuse memory cells.

63. An integrated circuit comprising:

a fully-decoded memory array of programmable memory cells, each memory cell coupled to an associated X-line and an associated Y-line;

a first X-line circuit normally configured to select one of a first plurality of X-lines associated with a first selected Y-line but configurable, during a test mode, to select more than one of the X-lines associated with the first selected Y-line; and a first Y-line sense circuit for sensing, when enabled, a read current on the first selected Y-line;

wherein, during the test mode, the X-line decoder is configured to select more than one of the first plurality of X-lines when the first Y-line sense circuit is enabled.

64. The invention defined by claim 63 wherein the first X-line circuit comprises:

a decoder circuit normally configurable to select one of the first plurality of X-lines by decoding a first group of address signals, and configurable during the test mode to select more than one of the plurality of X-lines by inhibiting a portion of the first group of address signals and decoding the remaining non-inhibited portion.

65. The invention defined by claim 64 wherein:

the inhibited portion represent contiguous low-order addresses for the X-line circuit, and the selected first plurality of X-lines during the test mode are contiguous in the memory array.

66. The invention defined by claim 63 wherein:

the memory array comprises a three-dimensional memory array having at least two planes of memory cells, each memory cell of a given plane coupled to one of a plurality of X-lines associated with the given plane and further coupled to one of a plurality of Y-lines associated with the given plane, wherein each Y-line is associated with a plurality of X-lines by virtue of the memory cells respectively coupled therebetween.

67. The invention defined by claim 63 further comprising:

an output for indicating whether a group of normally independently-decoded memory cells are unprogrammed.

68. The invention defined by claim 63 wherein:

the programmable memory cells comprise passive element antifuse memory cells.

* * * * *

UNITED STATES PATENT AND TRADEMARK OFFICE
CERTIFICATE OF CORRECTION

PATENT NO.     : 6,768,685 B1
DATED          : July 27, 2004
INVENTOR(S)    : Roy E. Scheuerlein It is certified that error appears in the above-identified patent and that said Letters Patent is hereby corrected as shown below:

<u>Title page,</u>
Item [73], Assignee, "Mtrix" should read -- Matrix --.
Item [56], References Cited, OTHER PUBLICATIONS, first reference, "09/894,704" should read -- 09/897,704 --

<u>Column 14,</u>
Line 19, insert -- . -- after "required".

<u>Column 16,</u>
Line 66, "circuit through" should read -- current through --.

Signed and Sealed this

Thirtieth Day of November, 2004

JON W. DUDAS
*Director of the United States Patent and Trademark Office*